United States Patent

Anemogiannis

[11] Patent Number: 5,128,640
[45] Date of Patent: Jul. 7, 1992

[54] SURFACE WAVE LOW FILTER LOSS HAVING COUPLING TRANSDUCERS

[75] Inventor: Kimon Anemogiannis, Muenchen, Fed. Rep. of Germany

[73] Assignee: Siemens Aktiengesellschaft, Berlin and Munich, Fed. Rep. of Germany

[21] Appl. No.: 671,913

[22] PCT Filed: Aug. 23, 1989

[86] PCT No.: PCT/DE89/00553
§ 371 Date: Mar. 20, 1991
§ 102(e) Date: Mar. 20, 1991

[87] PCT Pub. No.: WO90/03690
PCT Pub. Date: Apr. 5, 1990

[30] Foreign Application Priority Data

Sep. 28, 1988 [DE] Fed. Rep. of Germany ....... 3832943

[51] Int. Cl.⁵ .................................................. H03H 9/00
[52] U.S. Cl. ................................. 333/193; 333/194; 333/195; 333/196; 310/313 B
[58] Field of Search ............... 333/193, 194, 195, 196; 310/313 R, 313 B, 313 C, 313 D

[56] References Cited

U.S. PATENT DOCUMENTS 4,044,321 8/1977 Vasile ................................ 333/72
4,468,642 8/1984 Hikita ............................... 333/193

FOREIGN PATENT DOCUMENTS 0150312 8/1985 Japan .

Primary Examiner—Robert J. Pascal
Attorney, Agent, or Firm—Hill, Van Santen, Steadman & Simpson

[57] ABSTRACT

A surface wave filter has two tracks formed by interdigital transducers and coupling transducers on a substrate, wherein center-to-center path distances are defined between the transducers of a track. The relative center-to-center distances between the transducers comply with a particular relationship that depends on wavelength of the surface wave in the substrate. Correction factors are also applied to the relative relationships, which depend on whether the transducers defining each center-to-center distance are of the same type (symmetric or asymmetric) or whether one transducer is on one type and the other is of the other type within a track.

2 Claims, 1 Drawing Sheet

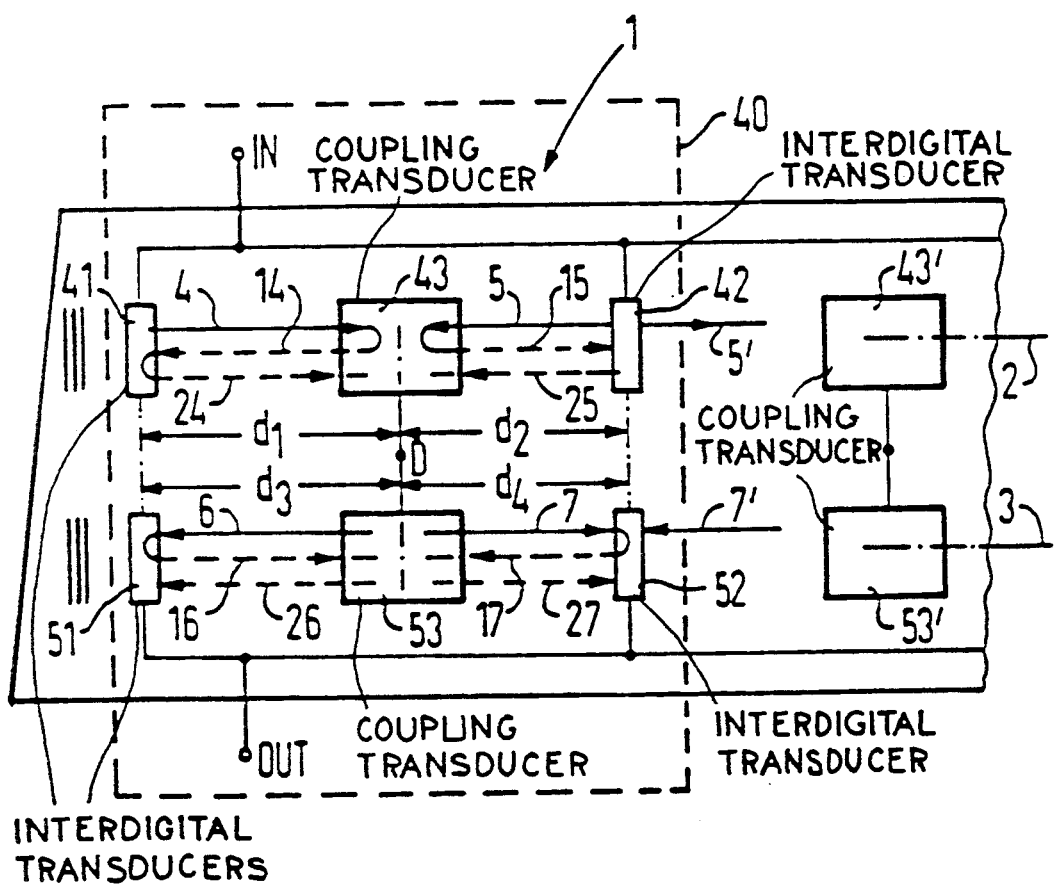

SURFACE WAVE LOW FILTER LOSS HAVING COUPLING TRANSDUCERS

BACKGROUND OF THE INVENTION

1. Field of the Invention

The present invention relates to a surface wave filter and, more particularly, to a low-loss filter having interdigital transducers and coupling transducers disposed on a substrate at selected distances from one another in two tracks.

2. Description of the Related Art

The surface wave filter which is disclosed in U.S. Pat. No. 4,468,642 is a bandpass filter, the transfer characteristic of which has low losses in the pass band and which has a high stopband attenuation and a steep edge slope. This known filter has two tracks with three or five or even more odd numbered interdigital transducers in each track, a track being the direction of wave propagation within the arrangement of transducers of each track. The two interdigital transducers at the end of each track have associated reflector arrangements which are provided for reflecting back the surface waves that have been sent out in the direction away from the transducer arrangements of the track from the end transducer, in such a manner that these end transducers act like unidirectional transducers. A coupling transducer is provided between the two end transducers of a track, which in the first track are, for example, input transducers. This also applies to the second track in which the transducers that are arranged on both sides of the relevant coupling transducer of the second track are the output transducers of the entire filter. Coupling between both tracks is effected by electrically connecting the one bus bar of a coupling transducer of the first track and the one bus bar of a coupling transducer of the second track. To obtain minimum loss, that is to say to obtain minimum matching attenuation, it is necessary that the two coupling transducers of the two tracks which are electrically connected to one another are very accurately matched to one another with respect to impedance. This requires identical coupling transducers. In practice, however, mismatching occurs to a certain extend which is based, among other things, on the effect described below.

Reference is made to the U.S. Pat. No. 4,468,642 for further details and for the operation of such a known bandpass filter in surface wave technology, as outlines above. FIGS. 1, 4 and 5 of the reference patent show embodiments and the further figures of the reference supply details on the transfer characteristics.

The drawing FIGURE attached to the present specification shows a very simple embodiment of such a known filter in which, the components contained within the dashed boundary form one cell of this filter. The cells can also be joined together in the case of the invention to form an embodiment according to FIG. 5 of the U.S. Pat. No. 4,468,642.

The cell 1 shown in the FIGURE has in the first track 2 two interdigital transducers 41 and 42, which are electrically connected in parallel and are to be operated, for example, as a filter input, and between the interdigital transducers 41 and 42 is a coupling transducer 43. Acoustic waves 4 and 5 that are excited and emitted by the transducers 41 and 42 are directed towards the coupling transducer 43 in a direction parallel to the track 2. In the coupling transducer 43, these acoustic waves 4 and 5 generate an electric signal (relative to ground) which occurs at circuit point DE (with respect to ground). The excitation by the acoustic waves 4 and 5 is such that, at the symmetric coupling transducer 43, these acoustic waves 4 and 5 must impinge on the coupling transducer 43 with identical phase. In the case of an anti-symmetric, or asymmetrical, coupling transducer 43, the impingement of the acoustic waves must be with opposite phases. The inter-digital transducers 41 and 42 are either symmetric or anti-symmetric transducers arranged at corresponding distances, relative to the coupling transducer 43. The arrangement of the transducers 51, 52 and 53 of track 3 is correspondingly the same as in track 2 with respect to phase. If the parallel-connected transducers 41 and 42 are the input of the filter, the parallel-connected transducers 51 and 52 are its output. The coupling transducer 53 is electrically excited starting from a circuit point D and sends out surface waves 6, 7 in the direction of transducers 51 and 52. If the coupling transducer 43 is symmetric, so is the coupling transducer 53. With an anti-symmetric coupling transducer 43, the coupling transducer 53 must also be anti-symmetric. Both coupling transducers 43 and 53 are of identical construction. If transducers 51, 52 and 53 are, for example, symmetric, surface waves 6 and 7 are allowed to impinge on the transducers 51 and 52 with the same phase, the distances d3, d4 being selected for this purpose. With an anti-symmetric transducer, distances matched to $(2n-1)\lambda/2$ must be provided, where $\lambda$ is the wavelength of the acoustic surface wave in the substrate. These measures are provided for matching. The reflector arrangements 40 have already been described above.

Such a filter in accordance with the FIGURE and in the manner of U.S. Pat. No. 4,468,642 shows disturbances in its transfer characteristic which are actually not expected and which impair the value of such a filter. These disturbances can be called mismatches but this does not describe their cause or even reveal a possibility for eliminating them.

SUMMARY OF THE INVENTION

It is the object of the present invention to specify as smooth as possible a disturbance-free transfer characteristic of a bandpass filter as described above, the type of which is known from U.S. Pat. No. 4,468,642.

This object is achieved by a surface wave filter having interdigital transducers and coupling transducers on a substrate in two tracks wherein the difference of the effective center-to-center path distances d1, d2, d3, d4 between each coupling transducer and the respective interdigital transducers associated with it are defined as follows:

$$d1 - d2 = n1 \cdot \lambda + k^* \quad (1)$$

$$d3 - d4 = n2 \cdot \lambda + k^{**} \quad (2)$$

$$d1 - d3 = n3 \cdot \lambda \pm (2n' - 1) \cdot \lambda/4 \quad (3)$$

$$d2 - d4 = n4 \cdot \lambda \pm (2n'' - 1) \cdot \lambda/4 \quad (4)$$

where n1, n2, n3, n4, n', and n'' are natural members, $\lambda$ is a wavelength of a surface wave in the substrate, and $k^*$ and $k^{**}$ are corrective factors defined as follows:

$k^* = 0$ in equation (1) if the first and second interdigital transducers and the first coupling transducer defining the first and second center-to-center distances are either symmetric or asymmetric (antisymmetric) transducers, $k^{**}=0$ in equation (2) if the third and fourth interdigital transducers and the second coupling transducer defining the third and fourth center-to-center distances are either symmetric or asymmetric transducers.

$k^*=(2n^*-1)\cdot\lambda/2$ in equation (1) if the transducer pair defining either of the first or second center-to-center distance d1 or d2 are both the same type of transducer (either symmetric or asymmetric transducers) and the transducer pair defining the other center-to-center distance d1 or d2 are a symmetric and an asymmetric transducer; and $k^{}=(2n^{}-1)\cdot\lambda/2$ in equation (2) if the transducer pair defining either of the third and fourth center-to-center distance d3 and d4 are both the same type of transducer (either symmetric or asymmetric transducers) and the transducer pair defining the other center-to-center distance d3 or d4 are a symmetric and an asymmetric transducer.

The present invention is based on the finding that the disturbances in the transfer characteristic discussed are based on unwanted mechanical and/or electrical reflections at the finger edges of the transducers involved. It has been found to be impossible to eliminate such reflections by direct measures. However, it has been found that so-called double transit signals occur in such a filter which cause such disturbances or ripples in the transfer characteristic.

The double transit signal must not be confused with triple transit signals which are known to occur in transducers, a two-track arrangement with measures for eliminating such triple transit signals being known form Japanese published application 60-150312.

For the rest, this arrangement necessitates relatively elaborate peripheral circuit components (for example the differential amplifiers) for its proper operation. Compared with the invention still to be described, the end transducers and the transducers located in the respective track have other functions there and there is no electrical coupling of two transducers in the filter.

BRIEF DESCRIPTION OF THE DRAWINGS

The FIGURE is a schematic illustration of a known surface wave filter also illustrating the principles of the present invention.

DETAILED DESCRIPTION OF THE PREFERRED EMBODIMENTS

The reference numerals 14 and 15 indicate surface wave energy components in FIG. 1 which are due to reflections of a surface wave 4 and of a surface wave 5, respectively, at or in the coupling transducer 43. Such returning waves 14, 15 have long been known per se and they in turn lead to returning waves 24 and 25, now reflected back at transducers 41 and 42. Corresponding reflected waves 16 and 17, respectively, and 26 and 27 occur between transducers 51, 52 and 53 of track 3, the transducer 53 being the coupling transducer associated with the coupling transducer 43.

The double transit signal has twice the group delay between input "IN" and output "OUT" in filter 1, compared with the single group delay of the waves of paths 4+6; 4+7; 5+6 and 5+7, namely the acoustic path distance of the nominal signal. However, mechanical and/or electrical reflections also occur in and at the transducers.

Double transit signals occur at the output "OUT" of the filter due to the wave sequences or double transit paths between input and output transducers 4+14+24+6; 4+14+24+7; 5+15+25+6; 5+15+25+7; and 10 also of paths 4+6+16+26; 4+7+17+27, 5+6+16+26 and 5+7+17+27. Independently of this, triple transit signals occur which cannot be discussed here and can be eliminated, for example, by known measures.

In a filter according to FIG. 1, however, quadruple transit signals also occur such as, for example, of paths 4+14+24+6+16+26; 4+14+24+7+17+27 and so forth.

Double and 2N-fold signals (with N=natural number) generating ripples are largely eliminated by means of the invention.

Measure of the invention are to dimension the distances between the transducers 41 and 43 (=d1), 42 and 43 (=d2), 53 and 51 (=d3) and 53 and 52 (=d4) of different lengths. The distances d are the center-to-center distances, that is to say the distances between the effective center of one transducer and the effective center of the respective other transducer.

According to the invention, the following dimensioning applies.

$$d1-d2 = n1\cdot\lambda + k^* \quad (1)$$

$$d3-d4 = n2\cdot\lambda + k^{**} \quad (2)$$

$$d1-d3 = n3\cdot\lambda \pm (2n'-1)\cdot\lambda/4 \quad (3)$$

From this follows the relation $$d2-d4 = n4 = n4\cdot\lambda \pm (2n''-1)\cdot\lambda/4, \quad (4)$$

Equation (4) given, equation (3) follows. In this, d1 to d4 are the center-to-center distances of the adjacent transducers from one another as specified above.

The variables n1, n2, n3, n4 and n', n" are natural numbers. The variables $k^*$ and $k^{**}$ are correction quantities.

For example $k^*=k^{**}=0$ holds true for exclusively symmetric or exclusively antisymmetric transducers 41, 42, 43, 51, 52, 53.

However, there are also cases in which symmetric and antisymmetric transducers occur together. It then holds true with respect to $k^*$ and $k^{**}$ that $k=(2n^*-1)-\lambda/2$ ($n^*$=natural number) if one transducer of transducers 41, 42, 43 of paths d1 and d2 of equation (1) is antisymmetric and the others are symmetric or if two transducers are antisymmetric and one transducer is symmetric. If this correspondingly applies to transducers 51, 52, 53 of the second track, that is to say of the equation (2), $k^{}=(2n^{}-1)\cdot\lambda/2$.

The correction factors $k^*$, $k^{**}$ are used for compensating for the phase errors which otherwise exist with symmetric/antisymmetric pairing of transducers of a path d1, d2, d3, d4.

Although other modifications and changes may be suggested by those skilled in the art, it is the intention of the inventors to embody within the patent warranted hereon all changes and modifications as reasonably and properly come within the scope of their contribution to the art.

I claim:

1. A surface wave filter, comprising: interdigital transducers and coupling transducers disposed at selected distances from one another on a substrate in two tracks, said distances being selected relative to a wavelength, λ of a surface wave on said substrate, wherein differences of effective center-to-center distances d1, d2, d3, d4, which are dimensioned between each of said coupling transducers and respective ones of the interdigital transducers associated therewith:

$$d1 - d2 = n1 \cdot \lambda + k^* \quad (1)$$

$$d3 - d4 = n2 \cdot \lambda + k^{**} \quad (2)$$

$$d1 - d3 = n3 \cdot \lambda \pm (2n' - 1) \cdot \lambda/4 \quad (3)$$

$$d2 - d4 = n4 \cdot \lambda \pm (2n'' - 1) \cdot \lambda/4, \quad (4)$$

where n1, n2, n3, n4, n', n" are natural numbers and the following holds true for correction quantities $k^*$, $k^{**}$:

$k^* = 0$ if the transducers of path distances d1, d2 of equation (1) are symmetric or antisymmetric transducers and $k^{**} = 0$ if the transducers of path distances d3, d4 of equation (2) are symmetric or antisymmetric transducers, or $k^* = (2n^* - 1) \cdot \lambda/2$ ($n^*$ = natural number) if the transducer pair of one path distance d1 or d2 of equation (1) consists of a symmetric and an antisymmetric transducer and, in addition, the transducer pair of the other path distance d1 and d2, respectively, are transducers of the same type of symmetry, and $k^{} = (2n^{} - 1) \cdot \lambda/2$ ($n^{**}$ = natural number), if the transducer pair of one path distance d3 and d4, respectively, of equation (2) consists of a symmetric or an antisymmetric transducer and, in addition, the transducer pair of the other path distance d4 and d3, respectively, are transducers of the same type of symmetry.

2. A surface wave filter, comprising:

a substrate first and second interdigital transducers with a first coupling transducer disposed therebetween mounted on said substrate to define a first center-to-center distance d1 between said first interdigital transducer and said first coupling transducer and a second center-to-center distance d2 between said first coupling transducer and said second interdigital transducer;

third and fourth interdigital transducers with a second coupling transducer disposed therebetween mounted on said substrate to define a third center-to-center distance d3 between said third interdigital transducer and said second coupling transducer and a fourth center-to-center distance d4 between said second coupling transducer and said fourth interdigital transducer, said first and second coupling transducers being electrically connected to one another;

said center-to-center distances conforming to the following relationships:

$$d1 - d2 = n1 \cdot \lambda + k^*$$

$$d3 - d4 = n2 \cdot \lambda + k^{**}$$

$$d1 - d3 = n3 \cdot \lambda \pm (2n' - 1) \cdot \lambda/4$$

$$d2 - d4 = n4 \cdot \lambda \pm (2n'' - 1) \cdot \lambda/4.$$

where n1, n2, n3, n4, n', and n" are natural numbers, $\lambda$ is a wavelength of a surface wave in said substrate, and $k^*$ and $k^{**}$ are corrective factors defined as follows:

$k^* = 0$ is said first and second interdigital transducers and said first coupling transducer are all one of symmetric and asymmetric transducers, $k^{**}0$ is said third and fourth interdigital transducers and said second coupling transducer are all one of symmetric and asymmetric transducers, $k^* = (2n^* - 1) \cdot \lambda/2$ if said transducers defining one of said first and second center-to-center distances d1 and d2 are both either symmetric or asymmetric transducers and said transducers defining another of said first and second center-to-center distances d1 and d2 are symmetric and asymmetric transducers, respectively, where $n^*$ is a natural number; and $k^{} = (2n^{} - 1) \cdot \lambda/2$ if said transducers defining one of said third and fourth center-to-center distances d3 and d4 are both either symmetric or asymmetric transducers and said transducers defining another of said third and fourth center-to-center distances d3 and d4 are symmetric and asymmetric transducers, where $n^{**}$ is a natural number.

* * * * *